United States Patent

Matsumoto et al.

[11] Patent Number: 6,117,566
[45] Date of Patent: Sep. 12, 2000

[54] LEAD FRAME MATERIAL

[75] Inventors: Tatsunori Matsumoto; Masami Noguchi; Kazuyoshi Aso, all of Shimodate, Japan

[73] Assignees: Nippon Denkai, Ltd.; North Corporation, both of Tokyo, Japan

[21] Appl. No.: 09/341,950

[22] PCT Filed: Jan. 21, 1998

[86] PCT No.: PCT/JP98/00210

§ 371 Date: Jul. 21, 1999

§ 102(e) Date: Jul. 21, 1999

[87] PCT Pub. No.: WO98/34278

PCT Pub. Date: Aug. 6, 1998

[30] Foreign Application Priority Data

Feb. 3, 1997 [JP] Japan ................................ 9-020613
Feb. 28, 1997 [JP] Japan ................................ 9-045199

[51] Int. Cl.$^7$ ........................................ B32B 15/20
[52] U.S. Cl. ...................... 428/675; 205/271; 205/291; 428/680; 428/687; 428/926; 428/929; 428/935
[58] Field of Search .................. 428/675, 680, 428/687, 926, 929, 935; 205/271, 291

[56] References Cited

U.S. PATENT DOCUMENTS 4,935,310 6/1990 Nakatsugawa ........................ 428/675
5,403,672 4/1995 Urasaki, et al. ........................ 428/675

FOREIGN PATENT DOCUMENTS 61-80844 4/1986 Japan .
1-146348 6/1989 Japan .
5308115 11/1993 Japan .
8-204081 8/1996 Japan .

Primary Examiner—Deborah Jones
Assistant Examiner—Kobert R. Koehler
Attorney, Agent, or Firm—Antonelli, Terry, Stout & Kraus, LLP

[57] ABSTRACT

A lead frame material, which can be provided with an etching stop layer without requiring a troublesome process such as vapor deposition and has an excellent heat-resistance, is obtained by forming a nickel-phosphorus alloy layer (B) of 1.6 to 10 μm thickness containing 0.3 to 1.0 wt % of phosphorus on a copper or copper alloy layer (A) of 35 to 300 μm thickness, and forming an optional copper layer (C) of 0.2 to 30 μm thickness on the nickel-phosphorus alloy layer (B).

11 Claims, No Drawings

LEAD FRAME MATERIAL

TECHNICAL FIELD

The present invention relates to a lead frame material useful for the production of lead frames, such as those for semiconductor devices.

BACKGROUND ART

As the integration of IC's and LSI's is increasing, the required pin-count is increasing, necessitating fine patterning of leads. Etching is suited to the production of lead frames having leads of fine patterns from lead frame materials. For example, Japanese Patent Application Unexamined Publication No. 3-148856 (1991) discloses production of lead frames by etching a three-layered lead frame material comprising two metal layers of different thicknesses and an aluminum etching stop layer sandwiched therebetween.

In the method, the etching stop layer enables selective etching of one of the two metal layers of different thicknesses. The thicker metal layer is to be the base material of the lead frame and is thick enough to afford the required mechanical strength. The thinner metal layer is to be the bonding areas for connection with IC's and is thin enough to form finely patterned bonding areas. Thus lead frames having both fine bonding areas for connection with IC's and sufficient mechanical strength can be produced by the selective etching.

The etching stop layer of the three-layered lead frame material used in the method, however, is an aluminum layer formed by vapor deposition. The vapor deposition for forming the aluminum layer disadvantageously requires a complicated process, which increases the production cost of the lead frame material.

Further, in the course of producing lead frame by the above-described method, the three-layered lead frame material is exposed to high temperatures when, for example, polyimide films are bonded as an insulating protective films to the surfaces of the lead areas with polyamic acid adhesives by curing the adhesives at 350° C. or higher. The etching stop layer therefore requires a good heat-resistance enough to withstand such a high temperature. For example, nickel layers, which are readily formed by electroplating, cannot act as etching stop layers, because copper diffuses from metal layers into the nickel layers at high temperatures of 350° C. or higher.

In Japanese Patent Application Unexamined Publication No. 5-121617 (1993) is disclosed the production of lead frames from a two-layered lead frame material comprising a first copper layer of 80 to 150 μm thickness and a second aluminum layer of 10 to 50 μm thickness, by selectively plating a third copper layer on the second aluminum layer, and then patterning the first copper layer to form inner leads. Having the aluminum layer as an etching stop layer, the two-layered lead frame material used in the method also involves the same problem as that with the three-layered lead frame material.

DISCLOSURE OF INVENTION

An object of the present invention is to provide a three-layered lead frame material and a two-layered lead frame material, which have an etching stop layer being able to formed readily by electroplating without requiring a troublesome process such as vapor deposition and having excellent heat-resistance.

As the results of studies to solve the above-described problems, the inventors have found that a specific alloy layer of a specific thickness is useful as the etching stop layer of three-layered and two-layered lead frame materials because it can be formed readily by electroplating without requiring a troublesome process such as vapor deposition and contributes excellent heat-resistance to the three-layered and two-layered lead frame materials. They have completed the present invention on the basis of the finding.

That is, the present invention provides a lead frame material, comprising a copper or copper alloy layer (A) of 35 to 300 μm thickness;

a nickel-phosphorus alloy layer (B) of 1.6 to 10 μm thickness which is formed on the copper or copper alloy layer (A) and contains 0.3 to 1.0 wt % of phosphorus; and a copper layer (C) of 0.2 to 30 μm thickness which is formed on the nickel-phosphorus layer (B).

The present invention further provides a lead frame material, comprising a copper or copper alloy layer (A) of 35 to 300 μm thickness; and a nickel-phosphorus alloy layer (B) of 1.6 to 10 μm thickness which is formed on the copper or copper alloy layer (A) and contains 0.3 to 1.0 wt % of phosphorus.

BEST MODE FOR CARRYING OUT THE INVENTION

The 35 to 300 μm thick copper or copper alloy layer (A) of the lead frame materials of the present invention is to be patterned into the outer leads or the like of lead frames. If it is less than 35 μm thick, the mechanical strength of the outer leads will be insufficient, and if more than 300 μm thick, it will take a long time to etch and lower the productivity. It is preferably 50 to 200 μm thick. Preferred copper alloys include alloys of copper with at least one metal selected from Sn, Ni, Zn, P, Fe, Zr, Cr, Mg and Si, and the content of other metals than copper in the copper alloy is preferably 0.01 to 5 wt %. The copper or copper alloy layer (A) preferably has a surface roughness Ra of 0.1 to 2.0 μm, more preferably 0.2 to 0.8 μm. If the surface roughness Ra is less than 0.1 μm, the adhesion of the nickel-phosphorus alloy layer (B) may be low, and if more than 2 μm, pin-holes may be made in the nickel-phosphorus alloy layer (B).

The 0.2 to 30 μm thick copper layer (C) of the three-layered lead frame material is to be patterned into fine patterns. If it is less than 0.2 μm or more than 30 μm in thickness, fine patterns cannot be formed. It is preferably 0.5 to 10 μm thick.

The 1.6 to 10 μm thick nickel-phosphorus alloy layer (B) is not etchable with the etchant for the copper or copper alloy layer (A). The function of this layer in the three-layered lead frame material is to prevent one of the layers sandwiching it from being etched while the other is being etched. Compared with the conventional aluminum layer which has been formed by vapor deposition, the nickel-phosphorus alloy layer (B) is advantageous because it can be formed readily by electroplating without requiring the troublesome process, thereby lowering the production cost of the lead frame materials. Further, it has good heat-resistance because the phosphorus contained in the nickel-phosphorus alloy inhibits the diffusion of copper from the adjacent layers into the nickel-phosphorus alloy layer (B) even at high temperatures. The phosphorus content in the nickel-phosphorus alloy layer (B) is 0.3 to 1.0 wt %, preferably 0.5 to 0.8 wt %. If the phosphorus content is less than 0.3 wt %, the heat-resistance will be too low to prevent the diffusion of copper into the nickel-phosphorus alloy layer (B), and the layer cannot work as an etching stop layer. If it is more than 1.0 wt %, the productivity will be low due to the low nickel-phosphorus electrodeposition efficiency.

If the nickel-phosphorus alloy layer (B) is less than 1.6 μm thick, it cannot fulfil the function of an etching stopping layer, namely the function of protecting one of the adjacent metal layers while the other is being etched. If it is more than 10 μm thick, the removal of the etching stop layer in the final stage of the production of lead frames will take a long time, thereby lowering the productivity. Preferred thickness is 2.0 to 5.0 μm.

The surface roughness Ra of the nickel-phosphorus alloy layer (B) somewhat depends on the surface roughness of the underlying copper or copper alloy layer (A), but is preferably 0.1 to 0.8 μm.

For the purpose of anticorrosion, the surface of the lead frame material is preferably treated with a chromate or a chromate containing zinc compounds.

The lead frame material of the present invention may be produced by forming the 1.6 to 10 μm thick nickel-phosphorus alloy layer (B) on one side of the 35 to 300 μm thick copper or copper alloy layer (A) by nickel-phosphorus plating, and, in case of the three-layered lead frame material, additionally forming the 0.2 to 30 μm thick copper layer (C) on the surface of the nickel-phosphorus alloy layer (B) by copper plating. If necessary, a chromate layer may be formed on the exposed surface of the copper layer (C).

When the two-layered lead frame material is used, fine bonding areas for connection with IC's can be formed by forming plating resist patterns on the nickel-phosphorus alloy layer (B) and then plating copper thereon. When the three-layered lead frame material is used, fine bonding areas for connection with IC's can be formed by etching the copper layer (C).

The copper-phosphorus plating is carried out preferably by using the following plating solution under the following plating conditions.

(1) The composition of plating bath

| nickel sulfate | 200–300 g/l |
|---|---|
| boric acid | 10–100 g/l |
| phosphorous acid | 0.2–20 g/l |
| sodium o-sulfobenzoic acid imide | 1–50 g/l |
| magnesium sulfate | 10–200 g/l |

(2) Electrolysis conditions
pH: 1.6–3.0, current density: 1–10 A/dm$^2$,
solution temperature: 20–70° C.

Preferred examples of the semiconductor devices which may be produced using the lead frame materials of the present invention include TBGA (tape ball grid array) devices and CSP (chip size package) devices.

The present invention will be described in more detail with reference to the following Examples. These examples, however, are not to be construed to limit the scope of the invention.

EXAMPLE 1

A 150 μm thick copper alloy foil (produced by Mitsubishi Shindo Co., Ltd., copper-nickel-tin alloy, trade name: TAMAC15, surface roughness Ra: 0.2 μm) was prepared, and was coated on its non-plating surface with a plastic film for preventing the deposition of electrolytic metal.

The following steps (1–5) were carried out in order by using the foil, to produce a three-layered lead frame material by forming on the copper alloy layer a nickel-phosphorus alloy layer (thickness: 2 μm, phosphorus content: 0.8 wt %, surface roughness Ra: 0.2 μm) and a copper layer (thickness: 2 μm, surface roughness Ra: 0.2 μm). After each of the steps 1–5, washing with water was carried out.

Production Steps
1. Degreasing
   (1) Degreasing solution
      sodium orthosilicate: 30 g/l
      sodium carbonate: 20 g/l
      sodium hydroxide: 20 g/l
   (2) Electrolytic degreasing conditions
      current density: 5 A/cm$^2$, treating time: 30 seconds,
      solution temperature: 40° C.
      cathode: copper alloy foil, anode: iridium oxide
2. Washing with acid
   (1) Washing solution
      sulfuric acid: 25 g/l
   (2) Washing conditions
      treating time: 30 seconds, solution temperature: 20° C.
3. Production of an electrolytic nickel-phosphorus alloy layer
   (1) Plating solution

| nickel sulfate | 300 g/l |
|---|---|
| boric acid | 40 g/l |
| phosphorous acid | 4 g/l |
| sodium o-sulfobenzoic acid imide | 10 g/l |
| magnesium sulfate | 80 g/l |

(2) Electrolysis conditions
      current density: 1.1 A/dm$^2$
      electrolysis time: 10 minutes
      solution temperature: 35° C.
      pH: 2.5
      anode: iridium oxide
4. Production of an electrolytic copper layer
   (1) Plating solution

| copper sulfate | 280 g/l |
|---|---|
| sulfuric acid | 70 g/l |
| additive (gelatin) | 3 ppm |
| additive (Cl$^-$) | 10 ppm |

(2) Electrolysis conditions
      current density: 3.5 A/cm$^2$
      electrolysis time: 4 minutes
      solution temperature: 35° C.
      anode: iridium oxide
5. Production of an anticorrosion layer
   (1) Treating solution

| sodium bichromate | 3.5 g/l |
|---|---|

(2) Treating conditions
      dipping time: 25 seconds
      solution temperature: 20° C.
      pH: 4.7
6. Drying
   drying conditions: temperature: 100° C., time: 5 minutes The three-layered lead frame material produced through the above-described steps was heated (200° C., 300° C., 400° C., 500° C.) for 30 minutes in the atmosphere of gaseous N$_2$, and then the following high-temperature thermomigration test was carried out to evaluate the heat-resistance of the lead frame material.

High-temperature Thermomigration Test

The test pieces heated to the different temperatures were analyzed on their sections (crossing the interface between the nickel-phosphorus alloy layer and the thinner copper layer) with an SEM (scanning electron microscope) and an Auger electron spectroscopy analyzer, to obtain the degree of the thermomigration alloying of metals caused by heating as the thermomigration percentages (%), which are given in Table 1. The lesser thermomigration percentage (%) indicates the lesser alloying of metals, and indicates the excellence of the lead frame material in heat-resistance and the ability of selective etching.

Comparative Example 1

A lead frame material was produced in the same manner as in Example 1 using the same copper alloy foil as that used in Example 1, except that the step 3 was replaced by the following step 3' for production of an electrolytic nickel layer to replace the nickel-phosphorus alloy layer by a nickel layer (thickness: 2 μm, surface roughness Ra: 0.2 μm). Thermomigration test was carried out in the same manner as in Example 1, and the results are given in Table 1.

3'. Production of an electrolytic nickel layer (1) Plating solution

| nickel sulfate | 280 g/l |
|---|---|
| boric acid | 40 g/l |
| sodium o-sulfobenzoic acid imide | 5 g/l |

(2) Electrolysis conditions
   current density: 1.0 A/dm$^2$
   electrolysis time: 10 minutes
   solution temperature: 35° C.
   pH: 2.5
   anode: iridium oxide

TABLE 1

| | Thermomigration percentage (%) | | | |
|---|---|---|---|---|
| | 200° C. | 300° C. | 400° C. | 500° C. |
| Example 1 | 0 | 0 | 0 | 50 |
| Comparative example 1 | 0 | 25 | 75 | 100 |

The results as given in Table 1 show that the lead frame material of Example 1 has good heat-resistance.

EXAMPLE 2

A lead frame material was produced in the same manner as in Example 1, except that the step 4 was not carried out. Thermomigration test was carried out in the same manner as in Example 1, and the results are given in Table 2.

Comparative Example 2

A lead frame material was produced in the same manner as in Comparative Example 1, except that the step 4 was not carried out. Thermomigration test was carried out in the same manner as in Example 1, and the results are given in Table 2.

TABLE 2

| | Thermomigration percentage (%) | | | |
|---|---|---|---|---|
| | 200° C. | 300° C. | 400° C. | 500° C. |
| Example 2 | 0 | 0 | 0 | 50 |
| Comparative example 2 | 0 | 25 | 75 | 100 |

The results as given in Table 2 show that the lead frame material of Example 2 has good heat-resistance.

Industrial Applicability

The lead frame materials of the present invention are not only suited for producing fine lead areas but also excellent in heat-resistance because it has an etching stop layer made from a nickel-phosphorus alloy. The lead frame materials of the present invention are also excellent in productivity because the etching stop layers thereof are nickel-phosphorus alloy layers which can be formed by electroplating without requiring troublesome processes such as vapor deposition.

What is claimed is:

1. A lead frame material, comprising:
   a copper or copper alloy layer (A) of 35 to 300 μm thickness, wherein the copper or copper alloy layer (A) is a copper alloy layer comprising an alloy of copper and at least one metal selected from the group consisting of Sn, Ni, Zn, P, Fe, Zr, Cr, Mg and Si;
   a nickel-phosphorus alloy layer (B) of 1.6 to 10 μm thickness which is formed on the copper or copper alloy layer (A) and contains 0.3 to 1.0 wt % of phosphorus; and
   a copper layer (C) of 0.2 to 30 μm thickness which is formed on the nickel-phosphorus layer (B).

2. The lead frame material of claim 1, wherein the nickel-phosphorus alloy layer (B) contains 0.5 to 0.8 wt % of phosphorus.

3. The lead frame material of claim 1, wherein the copper or copper alloy layer (A) has a surface roughness Ra of 0.1 to 2 μm.

4. The lead frame material of claim 1, wherein the nickel-phosphorus alloy layer (B) is formed by electroplating.

5. The lead frame material of claim 1, wherein the copper layer (C) is 0.5 to 10 μm thick.

6. A lead frame material, comprising
   a copper or copper alloy layer (A) of 35 to 300 μm thickness; and
   a nickel-phosphorus alloy layer (B) of 1.6 to 10 μm thickness which is formed on the copper or copper alloy layer (A) and contains 0.3 to 1.0 wt % of phosphorus.

7. The lead frame material of claim 6, wherein the nickel-phosphorus alloy layer (B) contains 0.5 to 0.8 wt % of phosphorus.

8. The lead frame material of claim 6, wherein the copper or copper alloy layer (A) is a copper alloy layer comprising an alloy of copper and at least one metal selected from the group consisting of Sn, Ni, Zn, P, Fe, Zr, Cr, Mg and Si.

9. The lead frame material of claim 6, wherein the copper or copper alloy layer (A) has a surface roughness Ra of 0.1 to 2 μm.

10. The lead frame material of claim 6, wherein the nickel-phosphorus alloy layer (B) is formed by electroplating.

11. The lead frame material of claim 6, which is a two-layered lead frame material.

* * * * *